United States Patent
Stengel et al.

(10) Patent No.: US 6,262,629 B1
(45) Date of Patent: Jul. 17, 2001

(54) HIGH EFFICIENCY POWER AMPLIFIER HAVING REDUCED OUTPUT MATCHING NETWORKS FOR USE IN PORTABLE DEVICES

(75) Inventors: Robert E. Stengel, Pompano Beach, FL (US); Wang-Chang A. Gu, Albuquerque, NM (US); Gustavo D. Leizerovich, Aventura, FL (US); Lawrence F. Cygan, Schaumburg, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/347,675

(22) Filed: Jul. 6, 1999

(51) Int. Cl.[7] ...................................................... H03F 3/68
(52) U.S. Cl. ..................... 330/124 R; 330/295; 330/286; 330/310
(58) Field of Search ............................... 330/124 R, 295, 330/286, 310, 289; 257/275

(56) References Cited

U.S. PATENT DOCUMENTS

| 5,012,200 | 4/1991 | Meinzer ............................ 330/124 R |
| 5,420,541 | 5/1995 | Upton et al. ......................... 330/286 |
| 5,568,086 | 10/1996 | Schuss et al. ..................... 330/124 R |
| 5,786,727 | 7/1998 | Sigmon ............................. 330/124 R |
| 5,880,633 | * 3/1999 | Leizerovich et al. ............. 330/124 R |
| 5,952,709 | * 9/1999 | Kitazawa et al. ..................... 257/275 |
| 5,986,508 | * 11/1999 | Nevin ................................... 330/289 |

* cited by examiner

*Primary Examiner*—Michael B Shingleton
(74) *Attorney, Agent, or Firm*—Scott M. Garrett (57) ABSTRACT

A power amplifier includes a carrier amplifier path and a peaking amplifier path. The carrier amplifier path includes a carrier amplifier (208), and an impedance transforming network (214). The peaking amplifier path includes a peaking amplifier (210), an impedance transforming network (216), and a phase delay quarter wave element (226). The arrangement forms an inverted Doherty combiner where as the nominal impedance at a summing node (230) increases with increased conduction from the peaking amplifier, the load impedance at the output of the carrier amplifier decreases so as to maintain the carrier amplifier at a saturation point as the input signal (232) increases, and results in a reduction of the number of phase delay elements needed over a conventional Doherty approach. In a preferred embodiment the carrier and peaking amplifiers consist of cascaded stages, and are disposed on a common integrated circuit die (304). The impedance transforming networks and phase delay element are disposed on a common substrate (306), as is an input splitter network (308).

9 Claims, 5 Drawing Sheets

HIGH EFFICIENCY POWER AMPLIFIER HAVING REDUCED OUTPUT MATCHING NETWORKS FOR USE IN PORTABLE DEVICES

TECHNICAL FIELD

This invention relates in general to power amplifiers for linear modulation systems, and more particularly to vector summing amplifiers for increasing amplifier efficiency.

BACKGROUND OF THE INVENTION

In designing a portable hand held communication device, there are numerous problems to be solved to produce a competitive product. One significant concern is the electric power demand of the communication device. Since these devices are powered by electric storage batteries, reducing the device's power demand will allow the device to operate longer for a given battery capacity. This so-called "talk time" is a critical market feature.

In recent years digital communication methods have gained popularity and provided cost effective solutions to subscriber capacity problems, among other problems associated with analog systems. Of the various digital communication schemes, linear modulation schemes, such as quadrature amplitude modulation, provide good bits per hertz per second performance. Linear modulation techniques also provide other benefits, such as reduced spectral occupancy. However, a significant drawback to linear modulation is that power amplifiers for converting direct current (DC) power to radio frequency (RF) power for linearly modulated signals necessarily operate below peak efficiency. This poor efficiency operation is due to the fact that the amplifying device must be biased to an average output power level low enough to accommodate peak input signal levels without overdriving the amplifying device. If the amplifying device is overdriven, the output signal will be distorted. Consequently, it is not uncommon for linear amplifiers to have an average efficiency of 15%–20% in applications that have, for example, a 6 decibel (dB) peak power to average power differential. Even with such a poor average efficiency, however, the benefit of linear modulation for communicating digital information is considered a beneficial compromise of current drain goals. Furthermore, several methods have been developed to improve the efficiency of linear amplifiers.

Since the power demand of the transmitter power amplifier accounts for a majority of the power consumption when transmitting, it is preferable to increase the power amplifier efficiency. One method used to improve efficiency is called supply modulation. Supply modulation is performed by varying the supply voltage to the amplifying device in correspondence with the input signal or the average input signal, which keeps the bias condition of the amplifying device near an optimum level for power conversion efficiency. Supply modulation has been developed to an extent where the supply voltage tracks the input signal, but this is a very sophisticated, complex, and expensive solution. Thus, an input tracking method is not a preferable choice for a typical hand held communication device design. More commonly, for low cost applications, supply modulation is done in increments. In the incremental approach the supply is set to a predetermined level corresponding to a given range of input signal amplitude. This method has been used with limited success in handheld communication devices.

The two parameters which govern amplifier efficiency are supply voltage, as discussed briefly above, and the load resistance. Manipulating either of these parameters can result in better power conversion efficiency. The idea of varying amplifier load impedance to improve efficiency can be seen in a Doherty amplifier configuration. The Doherty amplifier uses at least two amplifier paths, a carrier amplifier and a peaking amplifier, and combines their outputs in such a way that the load impedance presented to the carrier amplifier decreases as the input signal power increases above a preselected threshold level, such that the saturation point of the carrier amplifier is not exceeded. A discussion of Doherty operation is presented in U.S. Pat. No. 5,420,541 entitled "Microwave Doherty Amplifier."

The Doherty topology has been used widely in sophisticated and high power applications, such as land based microwave communication systems and satellite communication systems. It has generally not been considered for low cost hand held consumer oriented communication devices because of the complexity involved. For one, the space occupied by having an additional amplifier path goes against the industry goals of small size and low weight. Secondly, the output matching networks are also physically significant. Because of the frequency at which many portable communication systems operate, the transmission line elements used in output matching are substantially long compared to the size of the communication device. Although such transmission line elements can be designed as folded elements, the volume and weight, added to the volume and weight of an additional amplifier path have made the Doherty approach undesirable for hand held communication devices. Therefore there exists a need for an efficient linear amplifier for hand held communication devices that does not have the full weight and volume requirements of a conventional Doherty amplifier approach.

DETAILED DESCRIPTION OF A PREFERRED EMBODIMENT

While the specification concludes with claims defining the features of the invention that are regarded as novel, it is believed that the invention will be better understood from a consideration of the following description in conjunction with the drawing figures, in which like reference numerals are carried forward. A brief description of the prior art is also thought to be useful.

Figure 1:
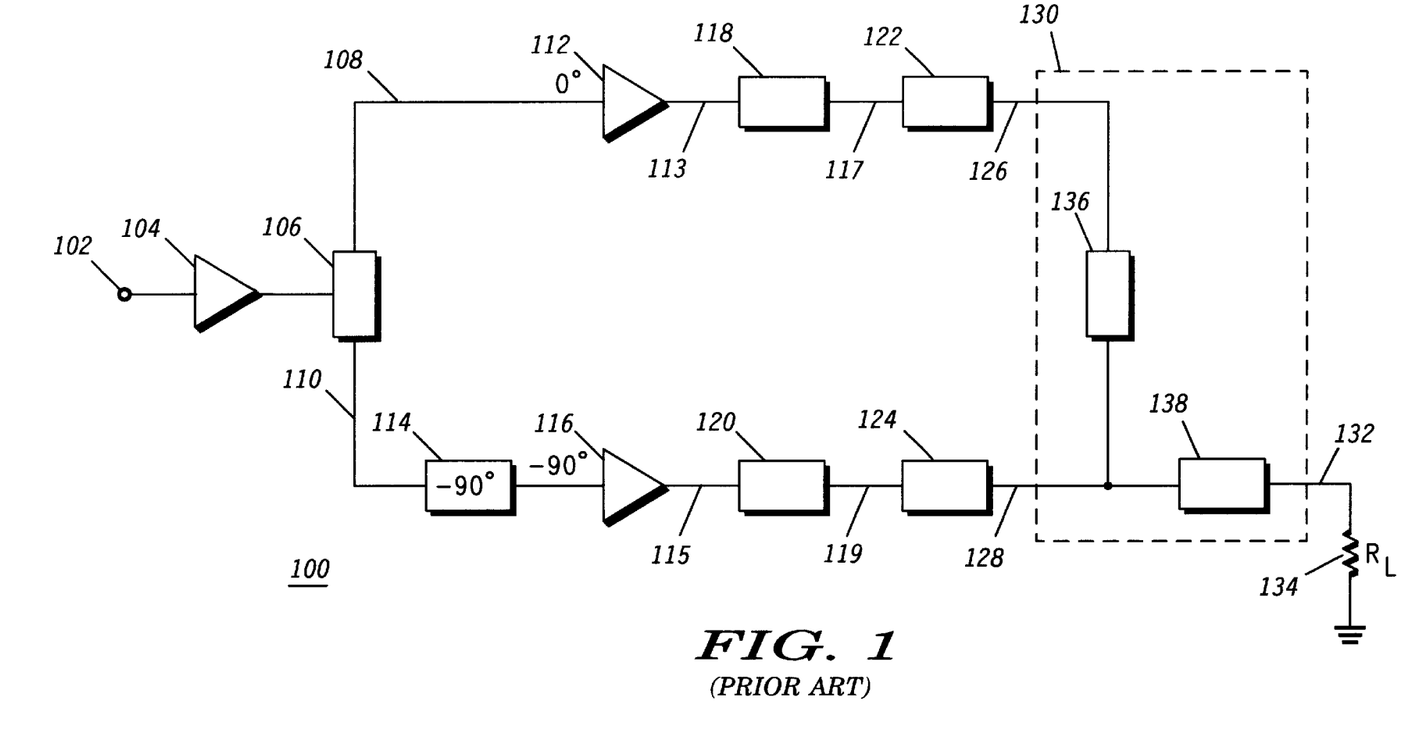
FIG. 1 shows a block diagram schematic of a prior art conventional Doherty amplifier.

Referring now to FIG. 1, there is shown a block schematic diagram of a prior art Doherty type amplifier 100. The amplifier system described here is very similar to that described in U.S. Pat. No. 5,568,086 entitled "Linear Power Amplifier for High Efficiency Multi-Carrier Performance." In FIG. 1, a linear modulated radio frequency signal is fed to an input 102, and may be amplified by a pre-amp 104 before being split by a splitter 106. The splitter produces two signals which are typically in phase with each other. A first signal 108 is fed to a first amplifier 112, and a second signal 110 is fed to a phase shifter 114 and shifted −90°, then fed to a second amplifier 116. The first amplifier 112 is a linear amplifier, and conducts between 180° to 360° of the input signal. It should be apparent to one skilled in the art that the amplifier block 112 comprises an input matching circuit, as is conventional in the art. The first amplifier 112 is, typically, a class A, B, or AB amplifier. The second amplifier only conducts when the first amplifier reaches a preselected output power level, and may be, for example, a class C amplifier with less than 180° of conduction. Each of the amplifiers are preferably implemented by field effect transistors (FETs), and more preferably with pseudomorphic high electron mobility transistors (PHEMTs).

The output of each amplifier is fed to a first matching network, 118 and 120, respectively, which are impedance transforming networks. These may be comprised of discrete or distributed components, and are designed to transform the amplifier's active device load impedance at the outputs 113 and 115, respectively, to conventional impedance levels, such as 50 ohms, at the other side of the matching networks, 117 and 119 respectively. It is well known that such matching networks invert the direction of change of impedance. For example, if the impedance at 117 decreases, the load impedance at 113 will increase, and vice-versa. In each amplifier leg, a second matching network 122 and 124, respectively, is used to reverse this effect of impedance change, as will be discussed further hereinbelow.

After the matching network elements, the signals from each amplifier are fed to first and second inputs 126 and 128, respectively, of a conventional Doherty combiner 130. The output 132 of the Doherty combiner is coupled to the load $R_L$ 134. The Doherty combiner has a summing node at the second input 128 where the signals of the first and second amplifiers are combined. Between the first and second inputs of the combiner is a quarter wave element 136 that has the same characteristic impedance as the real impedance component of the load 134. It also serves to bring the output of the first amplifier into phase with the output of the second amplifier. Another quarter wave element 138 is coupled between the second input 128 and the load, and has a characteristic value less than the impedance of the load. The second amplifier 116, commonly referred to as a peaking amplifier, only conducts when the first amplifier reaches saturation. Accordingly, the load presented to the first amplifier at 113 changes once the second amplifier begins to conduct. As the input signal amplitude at 102 increases beyond a level sufficient to drive the first amplifier to saturation, the effect of the increased output of the second amplifier at 128 reduces the impedance at 113 so as to maintain the first amplifier in saturation while the output power at the load 134 increases for another 6 dB, thus maintaining the first amplifier at peak efficiency.

In general, the input impedance looking into the first input 126 of the combiner 130 is at a higher value than the characteristic impedance of element 136 when the first amplifier 112 is below the saturation point. Once the first amplifier reaches saturation, its load impedance at 113 begins to decrease, as does the impedance at the first combiner input 126 because of conduction from the second amplifier. Thus, as the load impedance of the combiner at input 126 decreases, the desired amplifier load impedance decrease at 113 will occur in correspondence with conduction from the second amplifier. To achieve the effect of both the decrease in impedance at 126 and 113, two impedance transforming networks 118 and 122 are needed. The impedance at 117 changes in the opposite direction as the impedance at 113 and 126. Since the output impedance of these networks changes inversely with a change in the output impedance of a previous stage, two transforming networks are required to reverse the effect, and have the decreasing load impedance at the combiner input 126 result in a decreasing load impedance at the output of first amplifier 113, and vice-versa.

The operation of the transforming networks can be better understood with the following example. Assume that the load 134 is a 50 ohm load, the quarter wave element 138 between the load an the second input 128 has a characteristic impedance of 35.3 ohms, and the quarter wave element 136 between the first and second inputs has a characteristic impedance equal to the load, 50 ohms. The impedance looking into quarter wave element 138 towards the load will then be 25 ohms. It should be noted that many systems shown in the prior art simply combine element 138 with the load, or scale the other matching elements up to match directly to the load with the need for element 138. When the second amplifier 116 is not conducting, the impedance at the first input 126 looking towards the load will be 100 ohms. When the second amplifier conducts and reaches saturation, the impedance looking into the first input 126 will be 50 ohms, so long as the summing at the second input 128 is done correctly. This process of changing the impedance at the inputs of the combiner is known as impedance modulation.

The circuit configuration presented in FIG. 1 is well known and understood. Essentially, the second amplifier 116 allows the first amplifier 112 to avoid an overdrive condition while still increasing the output power delivered to the load by arranging the combiner 130 such that the load presented to the output of the first amplifier decreases once the initial saturation level is reached because of conduction from the second amplifier as the input signal at 102 increases further. However, in using strip line or transmission line elements for the matching networks 118, 120, 122, and 124, since they will be quarter wave elements, the physical length of these elements is inversely proportional to the operating frequency of the system. At sub-microwave frequencies, these elements have a substantial size relative to wireless personal communication devices. Since one of the most important goals in personal wireless communication devices is to reduce size and weight, it is preferable to reduce the number of these elements.

Figure 2:
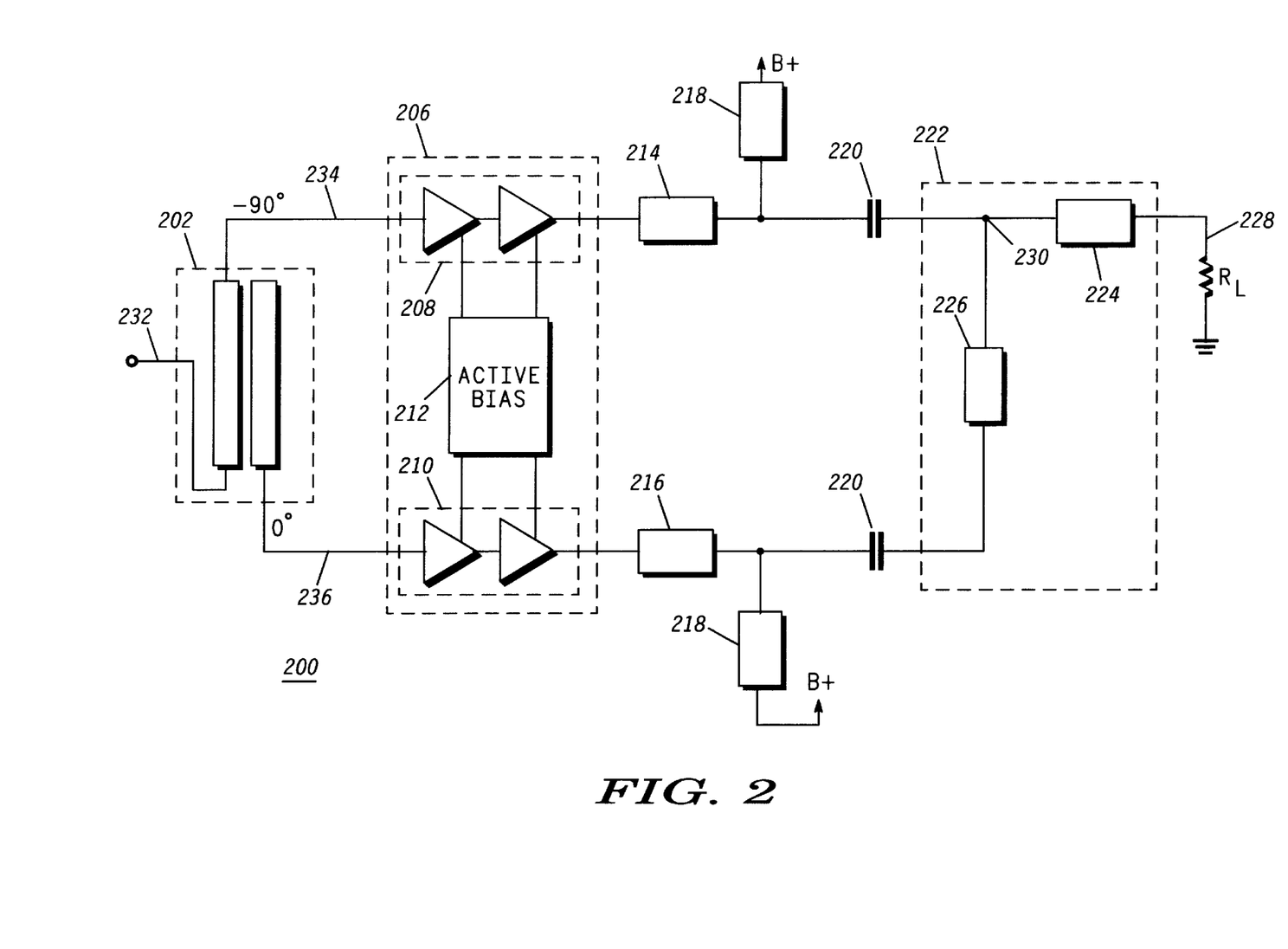
FIG. 2 shows a schematic circuit diagram of an amplifier circuit, in accordance with the invention.

Referring now to FIG. 2, there is shown therein a schematic circuit diagram of an amplifier circuit 200, in accordance with the invention. The circuit receives an input signal at a splitter 202 that splits the input signal into at least two parts on separate paths, such as a carrier amplifier path and a peaking amplifier path. The splitter is preferably a hybrid coupler that shifts one of the resulting two signals by −90 degrees. Each path is fed to an amplifier block 206. The amplifier block comprises a first amplifier 208 and a second amplifier 210, each of which, preferably, comprise two amplifiers in cascade. The first amplifier receives a signal from the splitter 202 that is shifted −90 degrees with respect to the signal fed to the second amplifier. These amplifiers are similar to the first and second amplifiers of FIG. 1, with the first amplifier 208 operating in a linear mode and conducting between 180° to 360° of the input signal. The second amplifier 210 conducts when the input signal is above a preselected threshold. In the vernacular of the art the first amplifier is referred to as a carrier amplifier and the second amplifier is referred to as a peaking amplifier. Each of the amplifiers 208, 210 amplify their respective input signals received from the splitter and phase shifter, and are preferably disposed together on a common integrated circuit die, along with an active bias circuit 212. The active bias circuit maintains the desired bias level of the amplifiers over the operating temperature range of the system. The outputs of the amplifier block from each of the amplifiers 208, 210 are fed to output matching networks 214, 216 respectively. Each amplifier leg is biased through a quarter wave element 218 so as to present a high impedance between the power source (B+) and the amplifier lines. Blocking capacitors 220 are provided in series to block the bias voltage. A combiner network 222 is used to combine the outputs of the amplifiers, and includes a first quarter wave element 224 and a second quarter wave element 226. The first and second quarter wave elements are arranged such that the output of the carrier amplifier 208 is fed to a summing node 230. Unlike the prior art, the output of the peaking amplifier 210 is fed to the summing node through a single impedance transforming network 216 instead of two networks. Finally, the summed signal is fed to the load 228 through the first quarter wavelength element. It will be appreciated by those skilled in the art that, although referred to as quarter wave elements, since it is intended that the amplifier system amplify signals over a given range of frequencies, the quarter wave elements are substantially quarter wave elements, but not necessarily an exact quarter wave element. Furthermore, it will be appreciated by those skilled in the art that the function of any quarterwave elements may be implemented with lumped components such as inductors and capacitors.

Thus, the preferred embodiment comprises a splitter network 202 for receiving the linear modulated signal and providing a phase delayed signal and an undelayed signal wherein the phase delayed signal is delayed by substantially −90 degrees with respect to the undelayed signal. It further comprises a carrier amplifier path for amplifying the phase delayed signal and including a carrier amplifier 208 and an output impedance transforming network 214 coupled between an output of the carrier amplifier and the summing node 230. It further comprises at least one peaking amplifier path for amplifying the undelayed signal, including a peaking amplifier 210 and an output impedance transforming network 216 coupled between an output of the peaking amplifier and a phase delay element 226. The phase delay element 226 is coupled between the output impedance transforming network 216 and the summing node 230, and provides substantially phase correction, which will generally be substantially −90 degrees. It will be appreciated by those skilled in the art that the phase delay element has a dual role. First, it provides a high impedance path when the peaking amplifier is not conducting so as not to load the summing node and carrier amplifier while it is off. Second, it corrects the phase of the signal from the peaking amplifier path such that, at the summing node, the signal from the carrier amplifier path and the peaking amplifier path(s) are substantially in phase. Practically speaking, since it is contemplated that the amplifier system will be used over a limited frequency range, there may be small phase differences, but not such that the substantial benefit of the invention is lost.

As in the prior art, a quarter wavelength element 224 is disposed between the summing node and the load. The first quarter wavelength element 224 has a characteristic impedance lower than the real impedance (resistance) of the load. The second quarter wavelength element 226 preferably has a characteristic impedance that is substantially equal to the real impedance of the load. By configuring the combiner in this fashion, the need for a second impedance transforming network in series with the first impedance transforming network is eliminated. For example, assuming the same impedances in the example given in reference to FIG. 1, the impedance looking towards the load from the summing node 230 at the point when the first amplifier reaches its saturation point, but prior to the point at which the peaking amplifier 210 begins conducting, is 25 ohms. In the prior art example, the impedance at the input to the combiner was 100 ohms under the same input signal conditions. As the input signal amplitude increases, the peaking amplifier 210 conducts proportionally to the input signal above the preselected threshold level, and the impedance at the summing node 230 increases to 50 ohms when the peaking amplifier 210 reaches its saturation point. So, by inverting the Doherty combiner, the load impedance of the carrier amplifier 208 changes inversely to the load impedance at the input of the combiner 230, and one stage of impedance matching can be eliminated. As the peaking amplifier increases its output, the output impedance of the carrier amplifier decreases and the impedance at the summing node looking towards the load increases. Since this follows the same effect a single quarter wave impedance matching element would perform, it follows that only one is required. Hence only a single stage of matching is needed between the output of the carrier amplifier and the input to the combiner 230. By inverting the combiner arrangement, a matching element can be eliminated, resulting in a favorable reduction of parts, and a substantial volume reduction over the prior art. The simplification in matching load impedance does not require the matching networks to have as high of a quality factor as when matching to a higher impedance with a prior art design. Being able to use a lower quality factor matching network provides the benefit of being able to match to a wider range of frequencies.

An additional phase shifting component can be eliminated by virtue of the hybrid coupler splitter 202 and the additional quarter wave element 226 in the second amplifier path. The hybrid splitter 202 is designed to split the input signal 232 into two signals with phase offset of 90°. As shown in FIG. 2, the first output 234 of the splitter provides a signal that is shifted by −90° with respect to the signal at the second output 236 of the combiner. The first output 234 is fed to the carrier amplifier 208 while the second output 236 is fed to the peaking amplifier 210. The splitter can be implemented, for example, with quarter wavelength coupled transmission lines or a Wilkenson splitter with an additional quarter wave transmission line in series with the first output 234. This would typically result in a passive splitter, with each leg having a 3 dB loss. However, it is contemplated that an active splitter could be used to minimize losses, and direct only enough signal power to the carrier amplifier and peaking amplifier as needed. If the carrier amplifier were at its maximum operating point, than any additional input signal power would be diverted to the peaking amplifier leg with an active splitter.

In designing the carrier and peaking amplifiers, 208 and 210 respectively, it is typically necessary to use cascaded amplifier stages. Cascaded stages are used because the typical maximum power gain of a single transistor stage is on the order of 15 dB. In order to get, for example, 40 dB of gain, at least three stage will typically be necessary. However, a careful arrangement of the stages can provide a significant boost in efficiency. In determining the optimum cascade arrangement for the present amplifier system, three scenarios were examined. A single ended approach with three stages was used as a benchmark. The choices of cascade arrangements are either to have two stages prior to the splitter, resulting in four amplifiers, or the arrangement shown in FIG. 2 which still uses two amplifiers in cascade for the carrier and peaking amplifiers, with one driver before the splitter. The overall efficiency can be expressed as a summation of efficiencies in the following equation:

$$\eta_T = 1/[(1/\eta_F) + (1/G_f\eta_{D1}) + (1/G_fG_{D1}\eta_{D2})]$$

Where:
- $\eta_T$ is the total efficiency;
- $\eta_F$ is the efficiency of the final stage;
- $G_F$ is the power gain of the final stage;
- $\eta_{D1}$ is the efficiency of the first driver stage;
- $G_{D1}$ is the power gain of the first driver stage; and
- $\eta_{D2}$ is the efficiency of the second driver stage.

The following calculations were based on a couple assumptions; first, that the efficiency $\eta_F$ at the average power level is equal to the efficiency at peak envelop power (PEP) for a conventional Doherty case, and second, that the gain was constant over output power. The numbers obtained were based on data from transistors, such as PHEMTs, and the application is a modulation scheme having a 6 dB peak to average power. It is preferable to decrease the gain with each successive stage, and it is assumed that the amplifiers are operated at a maximum of 3 dB down from saturation to preserve linearity. The first calculation was done with the benchmark system of three stages with gains of 14, 13, and 12 dB, in order, with the final stage having the lowest gain. In the benchmark case it was found that the efficiencies were 12.5%, 17.7%, and 25%, in order, with the final stage having the highest efficiency. The total efficiency, using the above equation, comes out to be about 22.8%. The second scenario places two drivers before the splitter of a Doherty type topology, and uses single stages for the carrier and peaking amplifiers. The final gain stage takes into account the copper and splitter losses, and drops the final gain to 8 dB. The efficiency of the peaking and carrier amplifiers is about 50%, and the total efficiency comes out at about 33.8%. Finally, with the first driver before the splitter, and a separate driver for both the carrier and peaking amplifiers, the carrier and peaking amplifiers have a net efficiency of 42.4%, but the total efficiency comes out at 41.3%. This reflects the principal that there is less overall power loss when the signal is split at low levels as opposed to amplifying it and then splitting it. A 3 dB loss of a 1 milliwatt signal results in less absolute loss than a 3 dB loss at, for example, 1 watt. Therefore, the cascade arrangement FIG. 2 is preferred to optimize efficiency.

Figure 3:
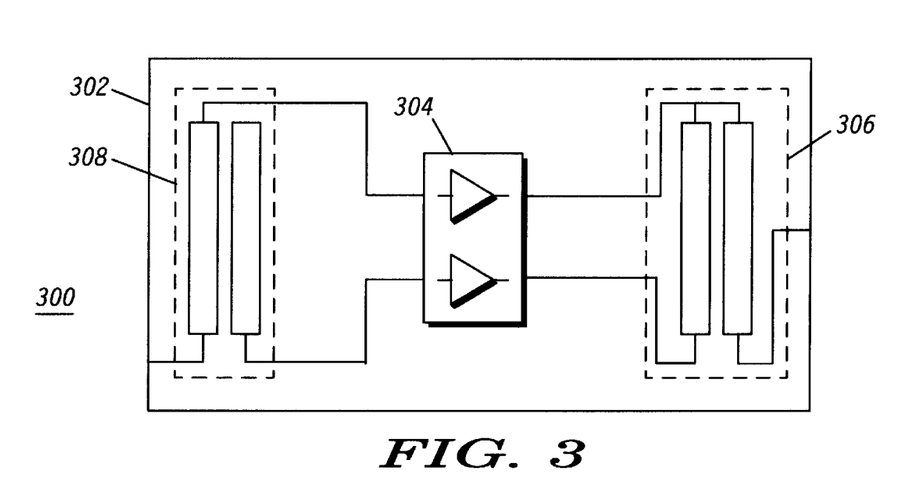
FIG. 3 shows a top plan view of a first implementation of an amplifier module in accordance with the invention.
Figure 4:
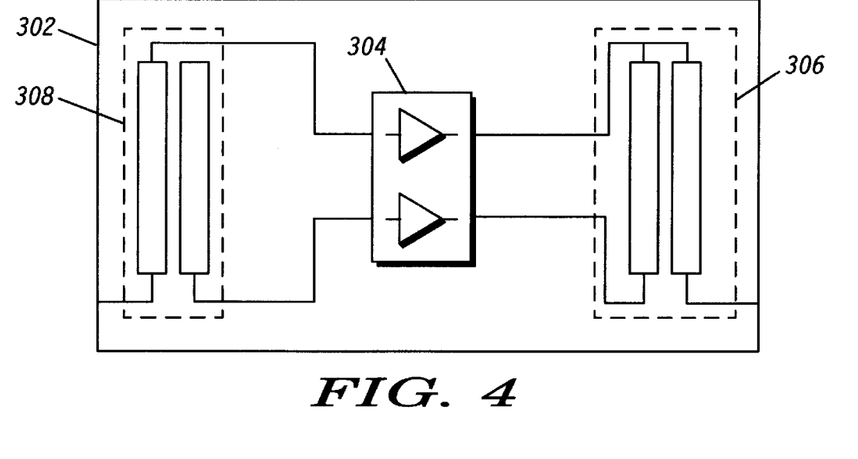
FIG. 4 shows a top plan view of a second implementation of an amplifier module in accordance with the invention.

In implementing the amplifier design of the present invention, there are two preferred embodiments, shown in FIGS. 3 and 4 respectively. FIGS. 3 and 4 are top plan views of amplifier modules in accordance with the invention. The amplifier modules can be used as "drop in" replacements for replacing single ended type linear power amplifiers in existing communication devices, such as cellular telephones. FIG. 3 shows a module 300 comprising a substrate 302 such as FR-4 printed circuit board material. Disposed on the substrate is an amplifier integrated circuit die 304, a combiner network 306 and a splitter network 308. The amplifier die 304 comprises substantially what is shown in the amplifier block 206 of FIG. 2, and is preferably disposed on the substrate using so-called chip-on-board technology, as is known in the art. This is an additional reason why it is preferable to have the cascaded stages after the splitter. If they were placed before the splitter, they would either be on a separate die, or there would have to be additional connections on the die to the board.

The combiner and splitter networks are preferably multi-layered ceramic modules containing strip transmission line elements to form quarter wave elements. It will be realized by those skilled in the art that, although referred to here as a quarter wave element, since amplifiers are generally intended to operate over a range of frequencies, the quarter wave elements are substantially quarter wave elements, and not always precisely quarter wave elements. The combiner network is substantially that shown in FIG. 2 as combiner network 222, and the splitter network 308 is substantially the same as that shown in FIG. 2 having the reference numeral 202. The amplifier integrated circuit die comprise the first and second amplifiers 208, 210 and the active bias circuit 212. The output matching networks 214, 216 may be included in the combiner network multi-layer ceramic module 306, as could the biasing feeds 218. FIG. 4 is substantially similar, except that substrate is ceramic, and the splitter and combiner modules are built into the substrate. By designing the amplifier system in accordance with the embodiments showing FIGS. 3 and 4, the amplifier system becomes a "drop in" replacement for single ended amplifier designs. That is, a single ended amplifier could be replaced by a module as shown in FIGS. 3 and 4 with minimal effort.

Figure 5:
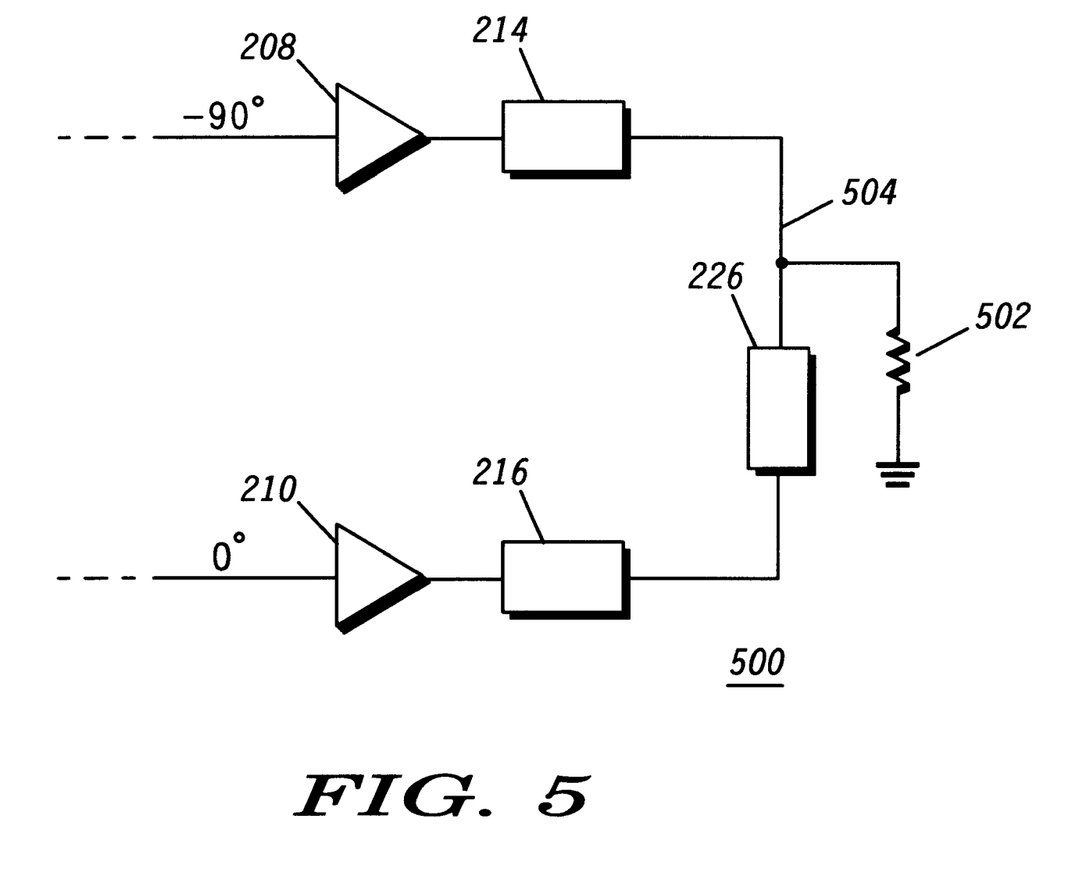
FIG. 5 shows a simplified circuit schematic diagram of a linear amplifier in accordance with the invention.

Referring now to FIG. 5, there is shown a simplified circuit schematic diagram 500 of an amplifier system in accordance with the present invention. In many prior art systems the output element 138 of FIG. 1 or element 224 of FIG. 2 are not shown, or not used. It will be appreciated by those skilled in the art that these elements may simply be viewed as part of the actual load, and result in a combined load 502. The resulting circuit schematic will then include components shown in FIG. 2, such as a carrier amplifier 208 and peaking amplifier 210, and corresponding output matching networks 214 and 216. In the simplified diagram the combining of the carrier and peaking output signals can be seen as occurring at node 504, which is essentially the same as node 230 in FIG. 2. The additional quarter wave element 226 corrects the phase of the output of the peaking amplifier to correspond with the phase of the output of the carrier at the combining node 504. Here it can easily be seen that the combining is, in a sense, inverted from prior art systems, which eliminates the need for additional matching network elements, and allows for lower quality factor networks, resulting in performance over a wider frequency range.

Figure 6:
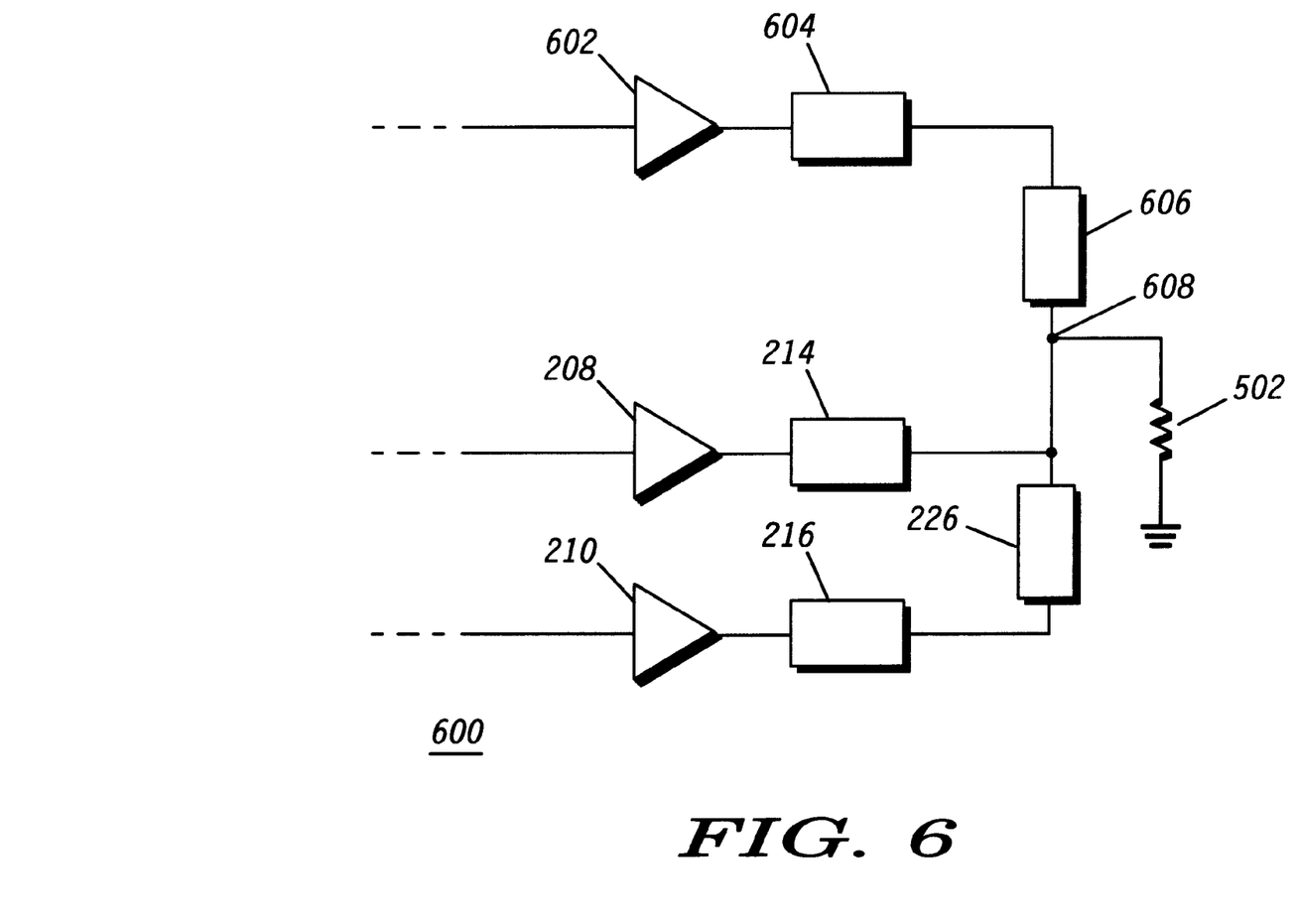
FIG. 6 shows a simplified circuit schematic diagram of a three legged embodiment in accordance with the present invention.

Referring now to FIG. 6, there is shown a simplified circuit schematic diagram 600 of a three path amplifier system in accordance with the invention. The amplifier systems using two paths, as in FIGS. 1, 2, and 5, have a range of 6 dB where the efficiency is high. By adding a third path, an additional peaking amplifier, the range is extended another 6 dB so that the range of high efficiency operation is 12 dB.—However, by employing the instant invention, and combining the paths at the output of the carrier amplifier (after impedance matching), a reduction of phase delay elements is realized, which is a significant benefit in using such amplifier systems in small, portable hand held communication devices. Thus, according to the invention, in a three path embodiment there would be a carrier path comprising a carrier amplifier 208 and a first peaking amplifier 210, along with corresponding matching networks 214 and 216. A phase delay element 226 couples the output of the first peaking amplifier to the output of the carrier amplifier. Once the first peaking amplifier reaches its saturation point (6 dB below the actual saturation point to preserve linearity), a second peaking amplifier 602 begins to conduct, and is load impedance matched through an associated impedance transforming network 604 and phase delayed through a quarter wave element 606 to a summing node 608. The signals of all three amplifiers sum at the summing node 608, and applied to load 502, which may include further matching elements. In this arrangement the carrier amplifier input signal is phase delayed by 90 degrees, and there is no phase delay on the inputs of the two peaking amplifiers. By preserving a maximum phase delay of 90 degrees, the additional output and input phase delay elements associated with a prior art three path system to accommodate up to 180 degrees of phase delay are a avoided. One skilled in the art will realize that additional paths could be added, each coupling it's output to the summing node 608, and there would be no more than a 90 degree phase adjustment needed in any path. This is a substantial benefit over conventional Doherty topologies.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A power amplifier for amplifying a linear modulated signal and providing an amplified signal to a load at a summing node, comprising:

a splitter network for receiving the linear modulated signal and providing a phase delayed signal and an undelayed signal wherein the phase delayed signal is delayed by substantially −90 degrees with respect to the undelayed signal;

a carrier amplifier path for amplifying the phase delayed signal and including a carrier amplifier and an output impedance transforming network, having a total phase delay of substantially 90 degrees, coupled between an output of the carrier amplifier and the summing node; and at least one peaking amplifier path for amplifying the undelayed signal and comprising a peaking amplifier and an output impedance transforming network coupled between an output of the peaking amplifier and a phase delay element, the phase delay element coupled between the output impedance transforming network and the summing node and providing substantially −90 degrees of phase delay.

2. A power amplifier as defined in claim 1, wherein the carrier amplifier comprises at least two cascaded stages, each stage consisting of a single transistor amplifier.

3. A power amplifier as defined in claim 1, wherein the peaking amplifier comprises at least two cascaded stages, each stage consisting of a single transistor amplifier.

4. A power amplifier as defined in claim 1, wherein:

the carrier amplifier and the peaking amplifier are disposed on a common integrated circuit die;

the common integrated circuit die is disposed on a substrate;

the output impedance transforming networks of the carrier amplifier path and the peaking amplifier path and the phase delay element of the peaking amplifier path consist of substantially quarter wave transmission line elements disposed together on an output substrate; and the splitter network is a hybrid splitter disposed on a splitter substrate.

5. A power amplifier as defined by claim 4 wherein the output substrate is a portion of the substrate on which the common integrated circuit die is disposed.

6. A power amplifier as defined by claim 4 wherein the splitter substrate is a portion of the substrate on which the common integrated circuit die is disposed.

7. A power amplifier for use in a hand held communication device for amplifying an input signal, the input signal being split into a phase delayed signal and an undelayed signal, the power amplifier comprising:

a carrier amplifier path for amplifying the phase delayed signal and including a carrier amplifier and an output impedance transforming network, having a total phase delay of substantially 90 degrees, coupled between an output of the carrier amplifier and a summing node for transforming a load impedance at the output of the carrier amplifier to a nominal impedance at the summing node;

at least one peaking amplifier path for amplifying the undelayed signal and comprising a peaking amplifier and an output impedance transforming network coupled between an output of the peaking amplifier and a phase delay element, the phase delay element coupled between the output impedance transforming network and the summing node and providing substantially −90 degrees of phase delay, the peaking amplifier conducting only when the input signal is sufficiently large enough to cause the carrier amplifier to operate in a saturated state; and wherein the nominal impedance at the summing node increases as the output of the peaking amplifier increases.

8. A power amplifier as defined in claim 7, wherein the carrier amplifier comprises at least two cascaded stages, each stage consisting of a single transistor amplifier.

9. A power amplifier as defined in claim 7, wherein the peaking amplifier comprises at least two cascaded stages, each stage consisting of a single transistor amplifier.

* * * * *